(12) United States Patent
Victor

(10) Patent No.: US 7,649,421 B2
(45) Date of Patent: Jan. 19, 2010

(54) QUALITY OF PHASE LOCK AND LOSS OF LOCK DETECTOR

(75) Inventor: Alan Victor, Raleigh, NC (US)

(73) Assignee: Harris Stratex Networks Operating Corporation, Morrisville, NC (US)

( * ) Notice: Subject to any disclaimer, the term of this patent is extended or adjusted under 35 U.S.C. 154(b) by 0 days.

(21) Appl. No.: 11/765,970

(22) Filed: Jun. 20, 2007

(65) Prior Publication Data

US 2008/0315961 A1   Dec. 25, 2008

Related U.S. Application Data

(60) Provisional application No. 60/945,052, filed on Jun. 19, 2007.

(51) Int. Cl.
*H03L 7/00* (2006.01)

(52) U.S. Cl. .......................... 331/16; 331/17; 327/157; 375/376

(58) Field of Classification Search .................. 331/16, 331/34, 111, 143; 327/156, 157; 375/373–376
See application file for complete search history.

(56) References Cited

U.S. PATENT DOCUMENTS

| | | | |
|---|---|---|---|
| 4,499,434 A | 2/1985 | Thompson | |
| 5,278,520 A | 1/1994 | Parker et al. | |
| 5,394,444 A | 2/1995 | Silvey et al. | |
| 5,525,932 A | 6/1996 | Kelkar et al. | |
| 5,719,532 A | 2/1998 | Nayebi et al. | |
| 5,724,007 A | 3/1998 | Mar | |
| 5,822,387 A | 10/1998 | Mar | |
| 5,838,749 A | 11/1998 | Casper et al. | |
| 5,870,002 A | 2/1999 | Ghaderi et al. | |
| 5,886,582 A | 3/1999 | Stansell | |
| 6,163,186 A | 12/2000 | Kurita | |
| 6,215,834 B1 | 4/2001 | McCollough | |
| 6,226,339 B1 | 5/2001 | Nam et al. | |
| 6,320,469 B1 | 11/2001 | Friedberg et al. | |
| 6,329,853 B1 | 12/2001 | Iinuma | |
| 6,429,901 B1 | 8/2002 | Kiyose et al. | |
| 6,483,361 B1 | 11/2002 | Chiu | |
| 6,496,554 B1 | 12/2002 | Ahn | |

(Continued)

*Primary Examiner*—James H. Cho
*Assistant Examiner*—Jany Tran
(74) *Attorney, Agent, or Firm*—Sheppard, Mullin, Richter & Hampton, LLP

(57) ABSTRACT

A system, apparatus and method for providing phase lock conditions detection such as a quality of phase lock and loss of lock detection. A phase locked loop (PLL) circuit may comprise an oscillator for providing an output frequency, as well as a detector for detecting the output frequency of the oscillator, comparing the output frequency with a reference signal and outputting a first and second signals as a function of the comparison. The PLL circuit may further include an amplifying circuit for receiving the first and second signals, monitoring a deviation of the first and second signals from a predetermined threshold, and generating a third signal as a function of the deviation. The PLL circuit may further comprise a comparison circuit for receiving the third signal, comparing the third signal to a window threshold, and generating a fourth signal as a function of the comparison. The window threshold may be a function of apriori knowledge of at least one loop variable, wherein the window threshold is set based on a predetermined loop variable. An alarm circuit may receive the fourth signal and provide an alarm.

31 Claims, 8 Drawing Sheets

U.S. PATENT DOCUMENTS

| | | |
|---|---|---|
| 6,566,920 B1 | 5/2003 | Kim |
| 6,744,838 B1 | 6/2004 | Dixit |
| 6,757,349 B1 | 6/2004 | Katayama et al. |
| 6,794,944 B2 | 9/2004 | Hirai |
| 6,853,254 B2 | 2/2005 | Li |
| 6,940,323 B2 | 9/2005 | Katoh et al. |
| 6,954,510 B2 | 10/2005 | Lee |
| 6,998,889 B2 | 2/2006 | Best |
| 7,061,332 B2 | 6/2006 | Siniscalchi et al. |
| 7,082,178 B2 | 7/2006 | Meltzer |
| 2004/0124936 A1* | 7/2004 | Li .................. 331/160 |
| 2004/0150480 A1 | 8/2004 | Lee |
| 2005/0035798 A1 | 2/2005 | Best |

* cited by examiner

QUALITY OF PHASE LOCK AND LOSS OF LOCK DETECTOR

This application claims the benefit of and incorporates by reference provisional Application No. 60/945,052 filed Jun. 19, 2007, titled "Quality of Phase Lock and Loss of Lock Detector."

BACKGROUND

Phase-locked loop ("PLL") circuits are found in many processing systems. They are, for example, commonly used to generate mixing signals in communications systems and clock signals for controlling the speed and synchronizing the operation of various components in microprocessor systems.

The structure of a PLL is generally well known in the art. FIG. 1 is an example of a prior art PLL circuit. With reference to FIG. 1, one common component of a prior art PLL 5 is a voltage controlled oscillator 25. The voltage controlled oscillator 25 ("VCO") may be a voltage controlled crystal oscillator ("VCXO"), a surface acoustical wave ("SAW") filter controlled oscillator, or other known oscillator in the art. The fundamental frequency of the VCO as established by the crystal or SAW filter may be adjusted or pulled in proportion to an input voltage signal $V_{IN}$. Thus, the frequency of the output timing signal $F_{out}$ may be modified in response to changes in the level of the input voltage signal $V_{IN}$. The input reference signal $F_{ref}$ is the timing reference signal either embedded in the transport signal or provided by an integrated timing supply known in the art, e.g., an accurate oscillator signal transferred independently of the transport signal to achieve synchronicity. A phase-frequency detector 10 may receive the input reference signal $F_{ref}$ and a feedback form of the output timing signal $F_{out}$. $F_{ref}$ and the feedback form of $F_{out}$ may be compared to determine the phase and frequency equivalence of $F_{ref}$ and the feedback form of $F_{out}$. The phase-frequency detector 10 has an output UP indicating that the phase-frequency of the VCO 25 requires adjustment to increase the frequency of $F_{out}$. The second output DOWN of the phase-frequency detector 10 indicates that the VCO 25 requires adjustment to decrease the frequency of $F_{out}$. The output signal UP and DOWN of the phase-frequency detector 10 may be provided as inputs to a charge pump 15. The charge pump 15 provides an output current $I_{CP}$ that is proportional to the desired frequency of $F_{out}$. $I_{CP}$ may then be provided to a low pass filter 20. The low pass filter 20 removes any undesired high frequency noise components that may be generated in the phase-frequency detector 10 or the charge pump 15 and creates the input adjustment voltage $V_{IN}$ for the VCO 25.

As is known in the art, the frequency of $F_{ref}$ may be a submultiple of the frequency of $F_{out}$. If such is the case for the design of the prior art PLL as illustrated, a frequency divider 30 may be optionally placed in the feedback path of $F_{out}$. The frequency divider 30 divides the frequency of $F_{out}$ such that $F_{ref}$ is compared with a feedback signal that is a submultiple of $F_{out}$.

FIG. 2 is a diagram of outputs of the phase-frequency detector and input reference signals of the prior art phase locked loop of FIG. 1. With reference to FIG. 2, the outputs UP and DOWN of the phase-frequency detector 10 are generally digital signals. In this example, the phase frequency detector 10 determines phase and frequency synchronicity at the fall 30, 35, and 40 of the input reference signal. During the time period A, if the phase and frequency of $F_{out}$ and $F_{ref}$ are aligned, the signal UP and the signal DOWN possess an equal pulse width. As shown during time period B, if the phase of $F_{out}$ lags or the frequency is lower than $F_{ref}$, the signal UP has a pulse width longer than the signal DOWN. If the phase of $F_{out}$ leads or the frequency is higher than $F_{ref}$, the signal DOWN has a pulse width longer than the signal UP. The charge pump 15 responds appropriately to create the necessary current, $I_{CP}$, which, when filtered, creates the input voltage $V_{IN}$ to adjust the VCO 25.

Determination of phase-frequency lock of PLLs is important for the functioning of circuits that are to receive and extract the data from the transport signal. Generally, the circuits provide lock notification signals indicating that the phase lock loop is in phase-frequency synchronization. U.S. Pat. No. 6,215,834 (McCollough), U.S. Pat. No. 5,886,582 (Stansell), U.S. Pat. No. 5,870,002 (Ghaderi, et al.), U.S. Pat. No. 5,838,749 (Casper, et al.), U.S. Pat. No. 5,822,387 (Mar), U.S. Pat. No. 5,724,007 (Mar), U.S. Pat. No. 4,499,434 (Thompson), and U.S. Pat. No. 5,394,444 (Silvey, et al.) are illustrative of circuits and systems that provide a notification of the phase-frequency synchronization. However, these notifications are limited to frequency error, loss of lock or loss of phase synchronization.

Thus, a continuing need exists in the art to permit a quality of lock detection in PLL circuits.

SUMMARY

Based in part on the foregoing observations, the present invention addresses lock conditions detection and related performance requirements in a wide array of phase locked loop applications. As a result, various system, apparatus and method embodiments of the present disclosure can provide a predictive form of lock and loss of lock conditions detection and evaluation. Examples of such embodiments are provided herein.

One embodiment of the present invention provides a phase locked loop ("PLL") circuit comprising an oscillator providing an output frequency and a detector for detecting the output frequency of the oscillator, comparing the output frequency with a reference signal and outputting a first signal and a second signal as a function of the comparison. The PLL circuit further comprises a charge pump operatively connected to the detector, the charge pump comprising a differential amplifier receiving the first and second signals, monitoring the deviation of the first and second signals from a predetermined threshold, and generating a third signal as a function of the deviation, and a comparator receiving the third signal, comparing the third signal to a window threshold, and generating a fourth signal as a function of the third signal and window threshold comparison. The PLL circuit may also comprise an alarm circuit which receives the fourth signal and is adaptable to provide an alarm. Various implementations may further comprise loop filters, limiters, and/or divide-by-N counters. Then, the third signal and window threshold comparison may further comprise measured static error from the window threshold.

The window threshold may be a function of apriori knowledge of respective one or more PLL parameters (i.e., loop variables). For example, the two thresholds of the window threshold may be set based on predetermined loop variables including but not limited to $K_0$, N, loop compensator, and/or charge pump gain variation. Loop variables may vary with changes in circuit operations and are thus predetermined for particular operating conditions. In one instance, the window threshold may be set as a function of loop variables predetermined for providing an early indication of performance degradation with an alarm. Alternatively, or additionally, the window threshold may be set as a function of loop variables predetermined for providing an alarm upon detecting loss of PLL phase lock. The apriori knowledge of PLL loop variables may be obtained via design specification, experimentation and the like.

Another embodiment of the present invention provides a method for controlling an oscillator. The method may comprise the steps of detecting an output frequency of an oscillator in a phase locked loop, comparing the output frequency with a reference signal, and outputting a first signal and a second signal as a function of the output frequency and reference signal comparison. The method may further comprise monitoring a deviation of the first and second signals from a predetermined threshold, generating a third signal as a function of the deviation, and comparing the third signal to a window threshold, the threshold being a function of apriori knowledge of at least one loop variable of the phase locked loop. The method may also comprise generating a fourth signal as a function of the third signal and window threshold comparison and providing an alarm if the fourth signal exceeds a predetermined value.

An additional embodiment of the present invention may provide a circuit for providing a control window for an oscillator in a phase locked loop. The circuit may comprise a detector circuit for defecting the output frequency of an oscillator, comparing the output frequency with a reference signal and outputting a first signal and a second signal as a function of the output frequency and reference signal comparison. The circuit may also comprise an amplifying circuit operatively connected to the detector circuit, the amplifying circuit receiving the first and second signals, monitoring the deviation of the first and second signals from a predetermined threshold, and generating a third signal as a function of the deviation. The circuit may further comprise a comparison circuit operatively connected to the amplifying circuit, the comparison circuit receiving the third signal, comparing the third signal to a window threshold, and generating a fourth signal as a function of the third signal and window threshold comparison. The circuit may additionally comprise an alarm circuit which receives the fourth signal and is adaptable to provide an alarm, wherein the window threshold is a function of apriori knowledge of at least one loop variable of the phase locked loop and provides upper and lower levels for oscillator parameters. Alternative embodiments of the present invention may further comprise loop filters, limiters, and/or divide-by-N counters. In an additional embodiment of the present invention, the third signal and window threshold comparison may further comprise measured static error from the window threshold.

Yet another embodiment of the present invention may provide a communication system comprising at least one radio frequency component adaptable to receive or transmit a signal in a predetermined frequency range, the component including circuitry comprising a PLL having an oscillator providing an output frequency and a detector for detecting the output frequency of the oscillator, comparing the output frequency with a reference signal and outputting a first signal and a second signal as a function of the comparison. The PLL may further comprise a differential amplifier receiving the first and second signals, monitoring the deviation of the first and second signals from a predetermined threshold, and generating a third signal as a function of the deviation, and a comparator receiving the third signal, comparing the third signal to a window threshold, and generating a fourth signal as a function of the third signal and window threshold comparison. The PLL circuit may also comprise an alarm circuit which receives the fourth signal and is adaptable to provide an alarm, wherein the window threshold is a function of apriori knowledge of at least one loop variable of the PLL. Alternative embodiments of the present invention may further comprise loop filters, limiters, and/or divide-by-N counters. In an additional embodiment of the present invention, the third signal and window threshold comparison may further comprise measured static error from the window threshold.

These embodiments and many other features and advantages thereof will be readily apparent to one skilled in the art to which the invention pertains from review of the claims, the appended drawings, and the following detailed description of exemplary embodiments.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION

The following description is provided in the context of this particular Application for Letters Patent and its requirements to enable a person of ordinary skill in the art to make and use the invention. Various modifications to the embodiments described and shown are possible. Thus, the invention is to be accorded the widest scope consistent with the principles, features and teachings disclosed herein.

Figure 1:
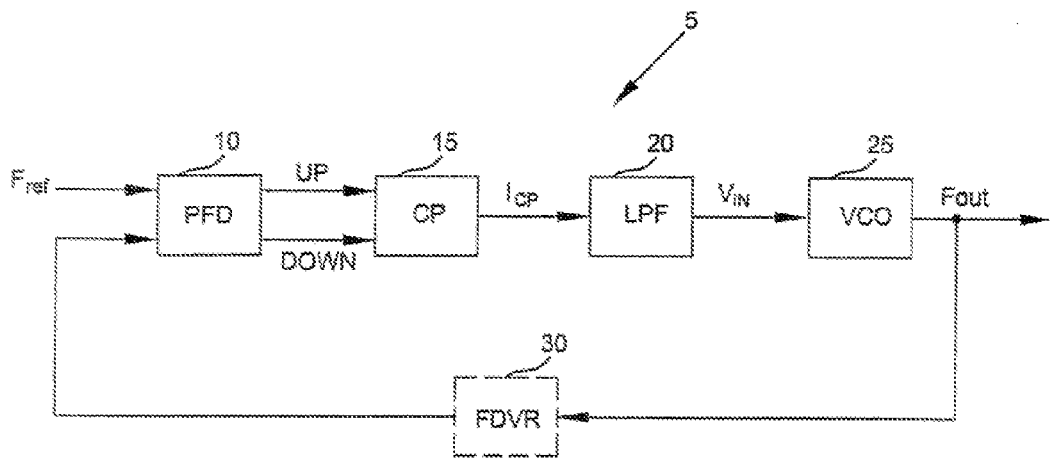
FIG. 1 is an example of a prior art phase locked loop (PLL) circuit.
Figure 2:
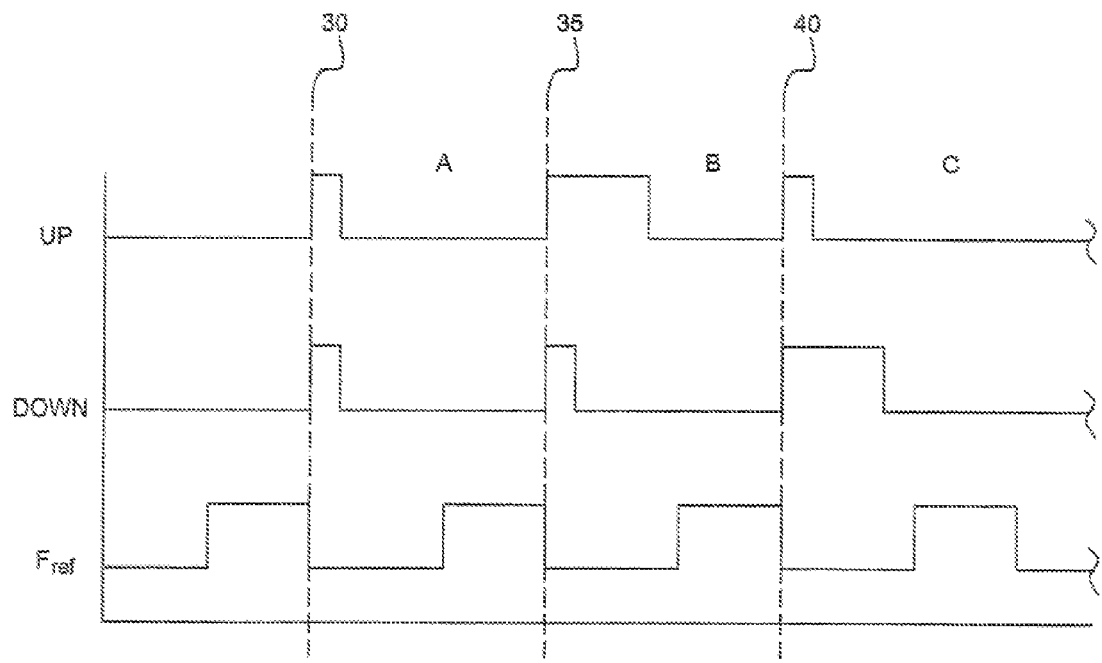
FIG. 2 is a diagram of outputs of the phase-frequency detector and input reference signals of the prior art phase locked loop of FIG. 1.
Figure 3:
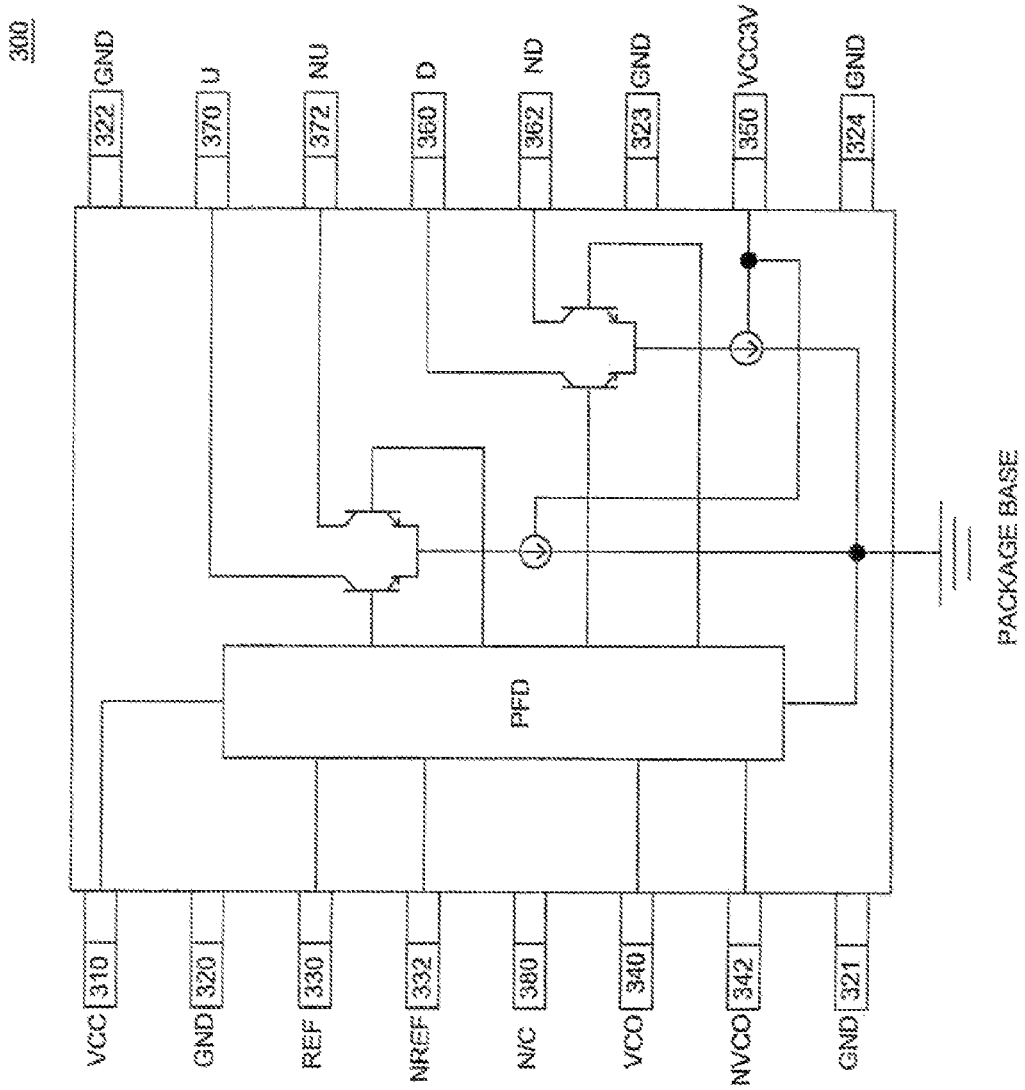
FIG. 3 is a functional diagram of a phase detector according to an embodiment of the present invention.

FIG. 3 is a functional diagram of a phase detector according to an embodiment of the present invention. With reference to FIG. 3, a phase detector 300 may generally receive an input reference signal 330 and reference input signal complement 332 and an input signal 340 from a voltage controlled oscillator ("VCO") (not shown) and VCO input compliment 342. The phase detector 300 may also provide an output UP 370 and UP compliment 372 indicating that the phase frequency of the respective VCO requires an adjustment to increase the frequency of a corresponding output timing signal. The phase detector 300 may also provide an output DOWN 360 and a DOWN compliment 362 indicating that the VCO requires adjustment to decrease the frequency of a corresponding output timing signal. Generally, the detector 300 accepts an input signal from the VCO, compares the input signal with a reference signal and outputs a first signal and a second signal, i.e., an UP and DOWN signal as a function of the comparison. These first and second signals may be provided as inputs to a charge pump (not shown) or other electronic circuit. Further, these first and second signals may be analog or digital signals.

An exemplary phase detector 300 may also include a supply voltage 310 and plural ground leads 320, 321, 322, 323, 324. Generally, the corresponding ground leads may be connected to a printed circuit board RF/DC ground. The phase detector 300 may further provide a 3.0 volt reference voltage 350 for an internal 10 mA current source. Any number of leads may or may not be used and/or connected 380.

Exemplary phase detectors 300 may be employed in low phase noise frequency synthesis applications such as point-to-point radios, point-to-multipoint systems, satellite communications systems, military applications, SONET clock generation, and the like. An exemplary phase detector 300 may also be employed in low noise PLL applications having inputs from 10 to 1300 MHz. Such a frequency range, however, is exemplary only and should not in any way limit the scope of the claims appended herewith. The phase detector 300 may provide a combination of high frequency of operation with a low phase noise floor thus making possible synthesizers having a wide loop bandwidth and low N resulting in fast switching and low phase noise. When utilized in conjunction with a differential loop amplifier, the phase detector 300 may also generate output voltages than can be utilized to phase lock a VCO to a reference oscillator. Exemplary phase detectors 300 may be packaged in low cost, surface mount sixteen lead quarter size outline packages ("QSOP") having an exposed base for improved radio frequency ("RF") and thermal performance.

Figure 4:
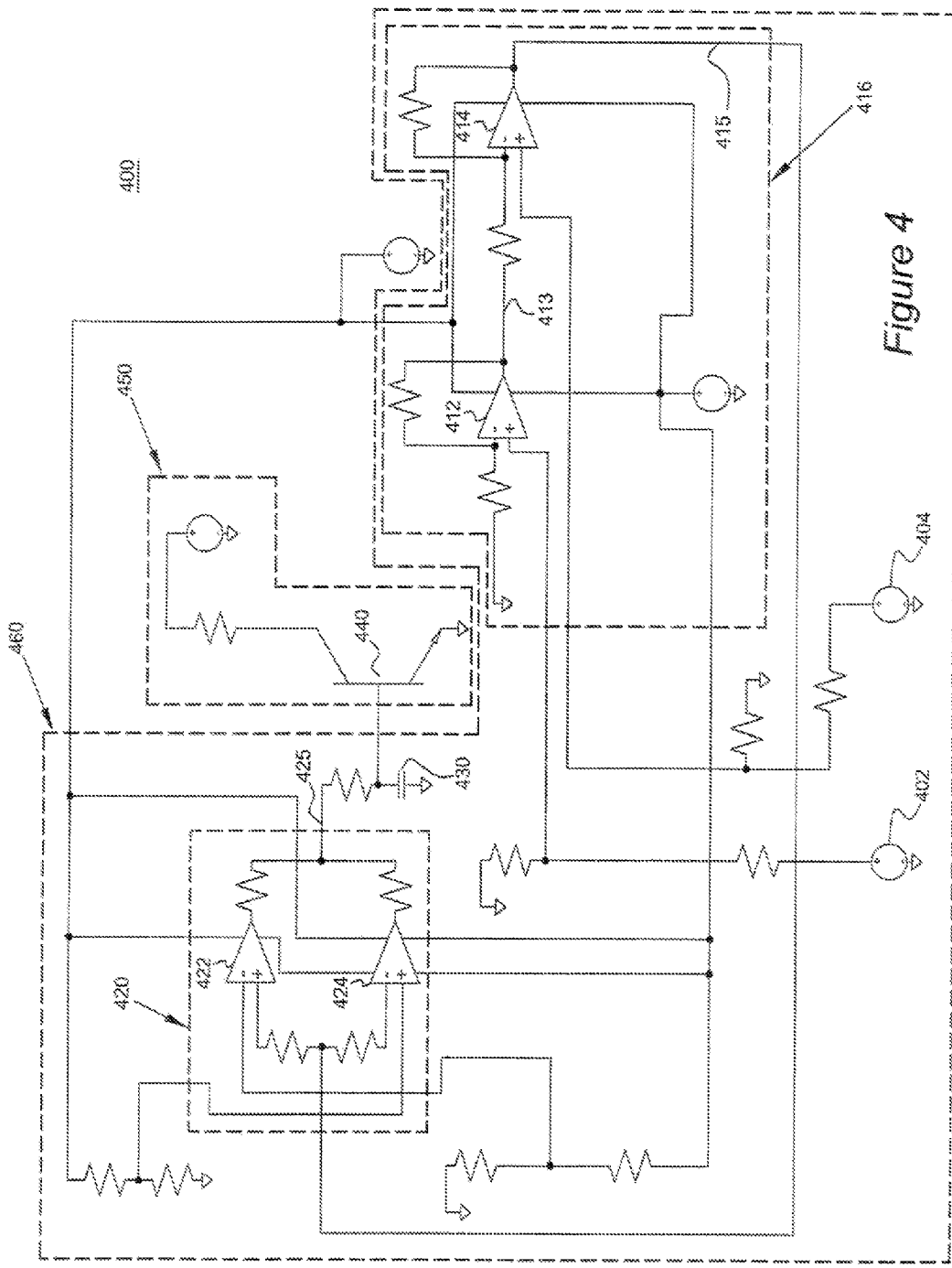
FIG. 4 is a diagram of a circuit in a PLL according to one embodiment of the present invention.

FIG. 4 is a diagram of a circuit in a PLL operative for detecting PLL lock and loss of lock conditions according to one embodiment of the present invention. As shown, this circuit 400 includes components such as a charge pump 460 and an alarm circuit 450, where the charge pump may include a differential amplifier 416, a comparator circuit 420, and a charge device such as one or more capacitors 430.

A phase detector such as the aforementioned phase detector 300 provides the input signals, namely, a first signal 402 and a second signal 404, to the respective inputs of the differential amplifier 416. The signals may generally be the up and down compliments 372, 362 or the up and down signals 370, 360 provided by the phase detector 300. The differential amplifier 416 may be configured where it comprises a first amplifier 412 and a second amplifier 414 and where the first and second signals 402, 404 are provided to the non-inverting inputs of the first and second amplifiers 412, 414, respectively. The first amplifier 412 accepts a reference signal at its inverting input and amplifies the difference between the two inputs to produce an output signal. For instance, the resulting output signal corresponds to $G(V^+ - V^-)$ when we assume a first amplifier 412 having an open loop gain of magnitude G that receives signals at its two inputs having respective values of $V^+$ and $V^-$. As configured in this instance, the output signal 413 of the first amplifier 412 is provided to the inverting input of the second amplifier 414. Thus, the second amplifier 414 produces an output signal 415 representative of the difference between the second signal 406 provided by the phase detector 300 and the output of the first amplifier 412. The differential amplifier 416 may thus monitor the deviation of the first and second signals 402, 404 from a predetermined threshold and generate an output signal 415 as a function of such deviation. While a differential amplifier having sequentially arranged amplifiers has been thus described, it is envisioned that other exemplary circuits may be utilized in embodiments of the present invention and such a description should not in any way limit the scope of the claims appended herewith.

As further shown, the differential amplifier 416 provides the output signal 415 to a comparator such as comparator circuit 420. The comparator circuit 420 in this circuit includes two amplifiers 422, 424 arranged in parallel such that the output signal 415 of the differential amplifier 416 may be compared to a window threshold to thereby generate an output signal 425. A comparison of the output signal 415 to a window threshold involves, in this instance, two thresholds 417, 419 applied to the inputs of amplifier 422 and amplifier 424, respectively, where at each of the amplifiers the output signal 415 is compared to the respective threshold. The window threshold may be a function of apriori knowledge of respective PLL parameters (loop variables). In other words, the two thresholds 417, 419 of the window threshold may be set based on predetermined loop variables including but not limited to $K_O$, N, loop compensator, and/or charge pump gain variation. Loop variables may vary with changes in circuit operations and are thus predetermined for particular operating conditions. For example, the window threshold may be set as a function of loop variables predetermined for providing an early indication of performance degradation with an alarm. Alternatively, or additionally, the window threshold may be set as a function of loop variables predetermined for providing an alarm upon detecting loss of PLL phase lock. The apriori knowledge of loop variables may be obtained via design specification, experimentation and the like.

Note, that while a comparator circuit having parallel-arranged amplifiers has been described, it is envisioned that other exemplary circuits may be utilized in embodiments of the present invention. Such description should not in any way limit the scope of the claims appended herewith.

From the comparator circuit 420, the output signal 425 may then be provided to an alarm circuit such as alarm circuit 450 to produce an alarm signal in response to an alarm condition such as when the quality of the respective PLL lock is degraded. Exemplary alarms may be, but are not limited to, a loss of frequency lock, quality of lock, loss of phase synchronization, frequency error, etc. alarms.

In this embodiment, the output signal 425 may charge a capacitor 430 or conversely, may allow the capacitor 430 to be slowly discharged to ground depending upon the value thereof. While a single capacitor 430 has been shown, it is envisioned that plurality of capacitors or a bank of capacitors may be utilized as the charge device. If the charge in the capacitor 430 is sufficient, the voltage at the base terminal of a transistor 440 will switch the state of the transistor 440 and provide an appropriate alarm that may thus be a function of the quality of the phase lock.

As mentioned, this combination of the differential amplifier 416, comparator circuit 420, and capacitor(s) 430 may also be referred to as a charge pump 460. In other words, in this embodiment the circuit includes the charge pump 460 alarm circuit 450 as described above.

Figure 5A:
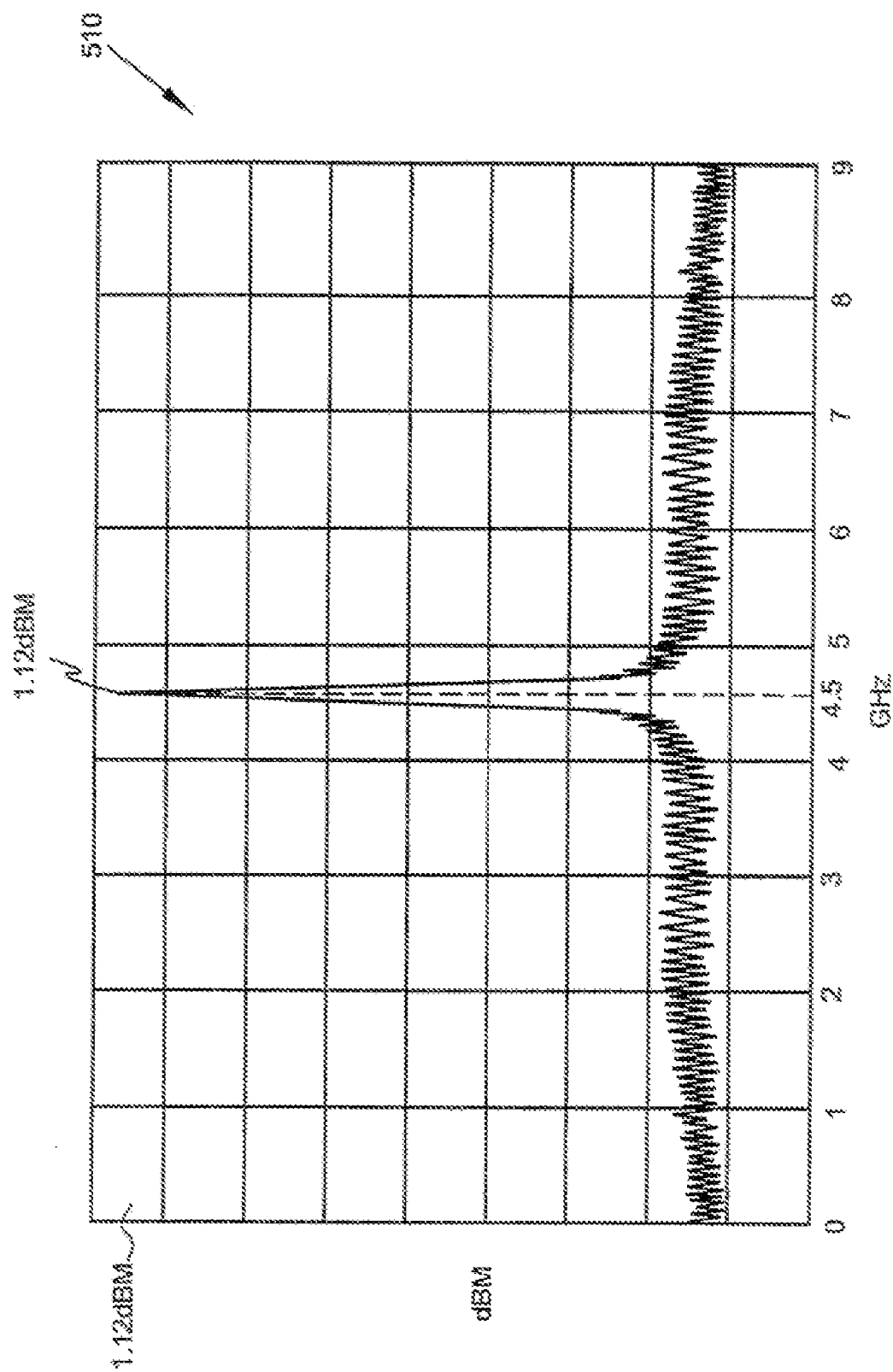
FIG. 5A is a graph of a frequency response of an embodiment of the present invention.
Figure 5B:
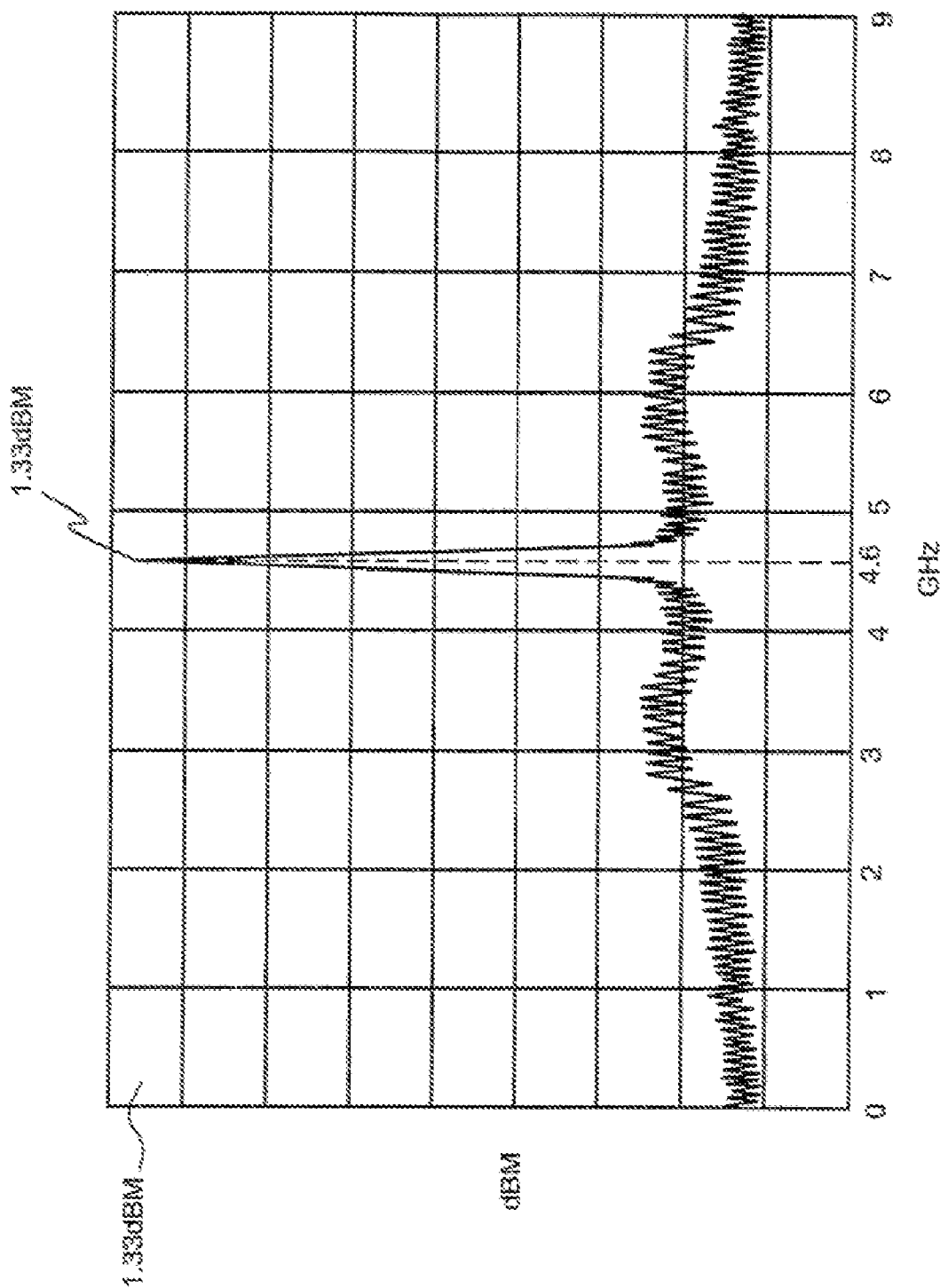
FIG. 5B is a graph of a loss of tune range event.
Figure 5C:
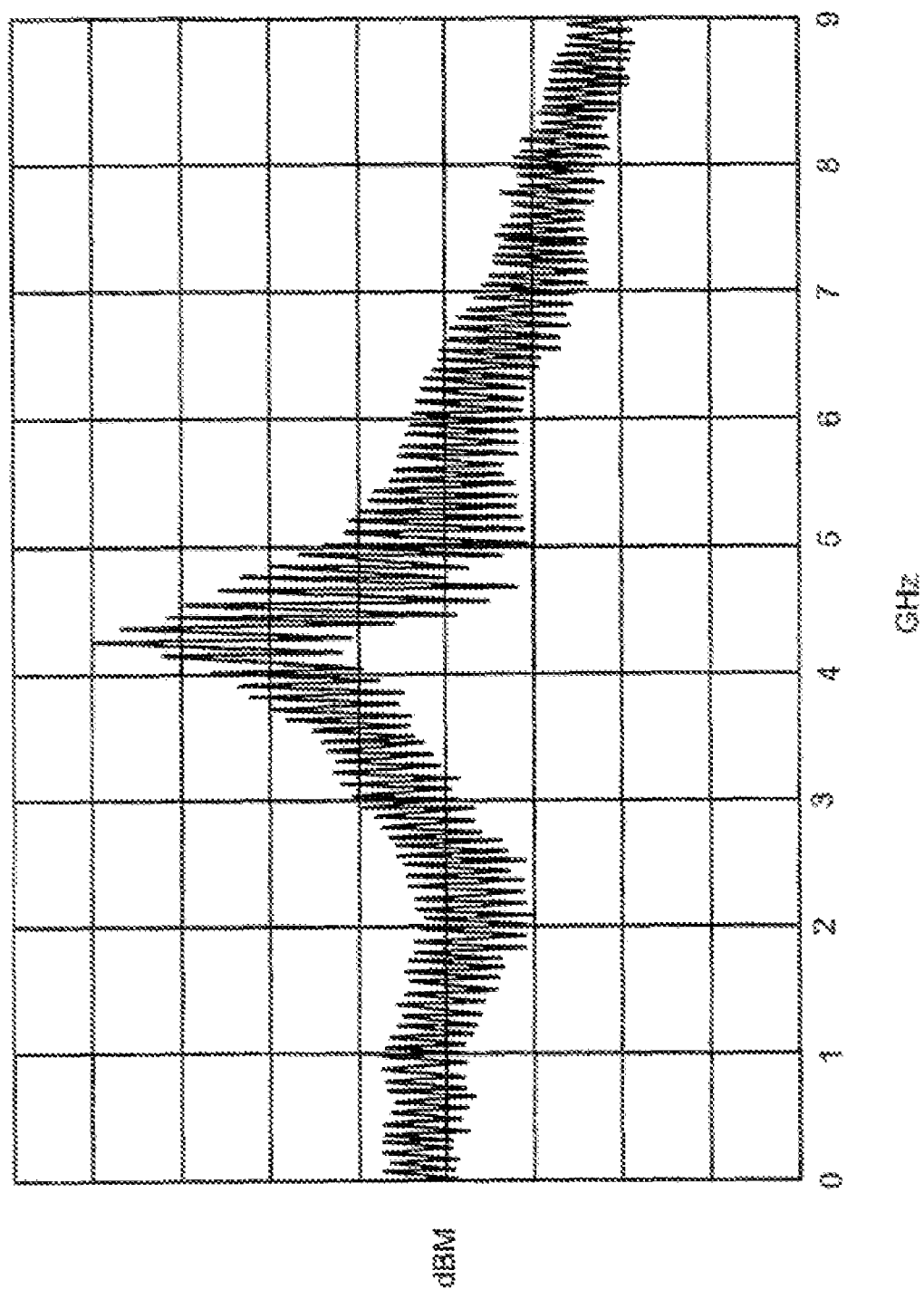
FIG. 5C is a graph of a loss of frequency lock event.

FIG. 5A is a graph of a frequency response of an embodiment of the present invention. FIG. 5B is a graph of a loss of tune range event. FIG. 5C is a graph of a loss of frequency lock event. With reference to FIG. 5A, embodiments of the present invention may provide normal operation 510 of a PLL or a system employing such a PLL having, for example, a center frequency of approximately 4.5 GHz with a power of 1.17 dBm. The normal operation 510 and frequency range illustrated in FIG. 5A is exemplary only and should not in any way limit the scope of the claims appended herewith. Thus, embodiments of the present invention may provide measurement of differential current or voltage of a charge pump network within a predetermined window and may thus establish a loss of lock criteria which is anticipatory to an event that may lead to phase noise peaking, a loss of tune range event (see, e.g., FIG. 5B), or a loss of frequency lock, event (see, e.g., FIG. 5C).

Figure 6:
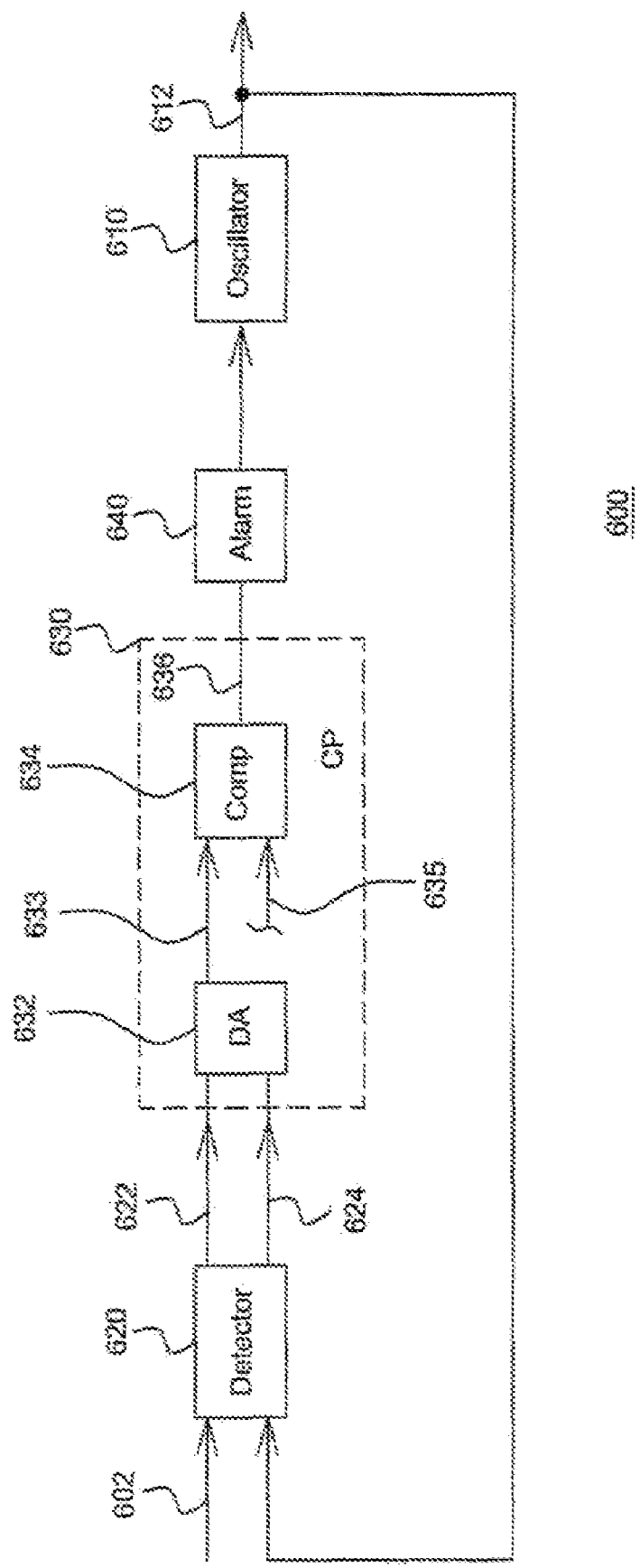
FIG. 6 is a block diagram of a circuit according to an embodiment of the present invention.

FIG. 6 is a block diagram of a circuit according to an embodiment of the present invention. With reference to FIG. 6, the circuit may be a PLL circuit 600 or may also be a circuit to provide a control window for an oscillator. An exemplary PLL circuit 600 may comprise an oscillator 610 providing an output frequency 612 and a detector 620 for detecting the output frequency of the oscillator. An exemplary oscillator may be, but is not limited to, a VCO, voltage controlled crystal oscillator ("VCXO"), temperature compensated voltage controlled crystal oscillator ("TC-VCXO"), numerically controlled oscillator ("NCO"), and/or digitally controlled oscillator. An exemplary detector may also be, but is not limited to, a phase frequency detector. The detector 620 may compare the output frequency 612 with a reference signal 602 and output a first signal 622 and a second signal 624 as a function of the comparison. In an additional embodiment of the present invention, the first signal 622 may also be a function of static phase detector gain.

The PLL circuit 600 may further comprise a charge pump 630 operatively connected to the detector 620. The charge pump 630, according to one embodiment of the present invention, may comprise a differential amplifier 632 that receives the first and second signals 622, 624, monitors the deviation of the first and second signals 622, 624 from a predetermined threshold, and generates a third signal 633 as a function of the deviation. The charge pump 630 may also comprise a comparator 634 that receives the third signal 633, compares the third signal 633 to a window threshold 635, and generates a fourth signal 636 as a function of the third signal 633 and window threshold comparison. The charge pump 630 may be a current or voltage charge pump. The window threshold 635 may be a function of apriori knowledge of at least one loop variable of the PLL. The loop variable may be, but is not limited to, oscillator gain, N, loop compensation, and charge pump gain variation. The PLL circuit 600 may also comprise an alarm circuit 640 which receives the fourth signal 636 and is adaptable to provide an alarm. The alarm may be utilized by the circuit 600 or external circuits to maintain the output frequency within a predetermined range. In an additional embodiment of the present invention, the third signal 633 and window threshold comparison may further comprise measured static error from the window threshold 635. Alternative embodiments of the present invention may also include loop filters, limiters, and/or divide-by-N counters. The aforementioned circuit may also be employed to provide a control window for an oscillator in a PLL. Thus, for example, the window threshold may be a function of apriori knowledge of at least one loop variable of the PLL and may provide upper and lower levels for oscillator parameters. These parameters may be phase, frequency, or phase-frequency parameters.

Figure 7:
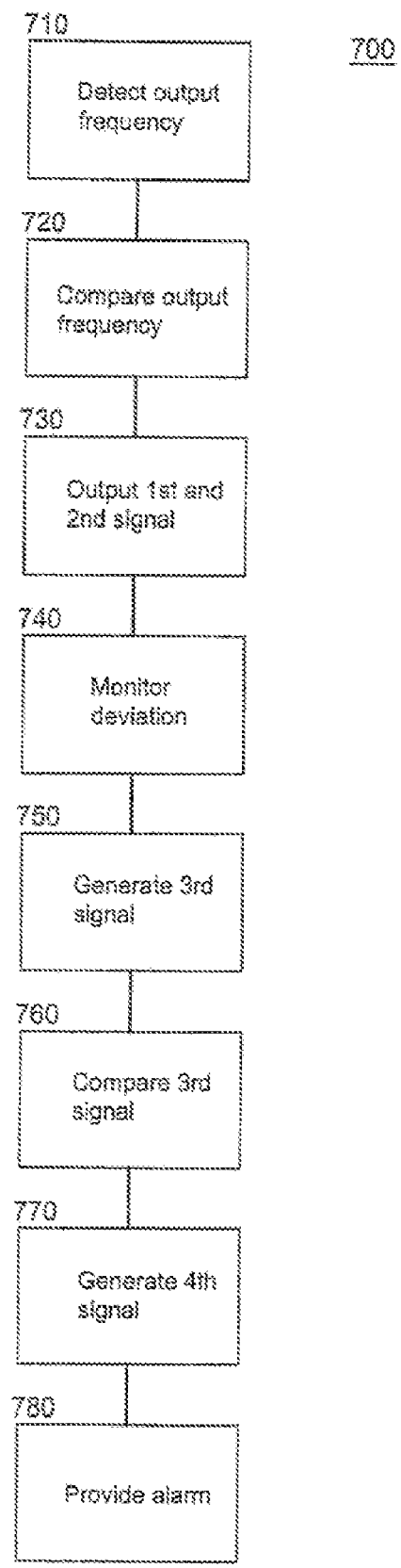
FIG. 7 is a block diagram of an algorithm according to an embodiment of the present invention.

FIG. 7 is a block diagram of an algorithm according to an embodiment of the present invention. With reference to FIG. 7, a method for controlling an oscillator is provided that comprises the steps of detecting an output frequency of an oscillator in a phase locked loop as represented by step 710. An exemplary oscillator may be, but is not limited to, a VCO, VCXO, TC-VCXO, NCO, and/or digitally controlled oscillator. The output frequency may then be compared with a reference signal (step 720) and a first signal and a second signal may be outputted as a function of the output frequency and reference signal comparison as represented by step 730. In another embodiment of the present invention, the first signal may be a function of static phase detector gain. In step 740, a deviation of the first and second signals from a predetermined threshold may be monitored whereby a third signal may be generated as a function of the deviation (step 750). This third signal may then be compared to a window threshold in step 760. In one embodiment, the threshold may be a function of apriori knowledge of at least one loop variable of the phase locked loop. In an additional embodiment, the third signal and window threshold comparison may further comprise measured static error from the window threshold. As represented by step 770, a fourth signal may be generated as a function of the third signal and window threshold comparison and an alarm provided in step 780 if the fourth signal exceeds a predetermined value. In further embodiments of the present invention, the alarm may also be utilized to maintain the output frequency within a predetermined range.

It is one aspect of embodiments of the present invention to sample static phase detector gain in a frequency phase lock loop. Deviation of the measured static error from a predetermined level may be monitored and used to control an out of lock alarm. Further, the window threshold may be set such that prior to spectrum degradation, an alarm may occur. Such an addition of frequency phase lock detection to analog and digital detectors with a charge pump may permit quality of lock detection and circuits according to embodiments of the present invention may thus not be limited to frequency error, loss of lock or simply a loss of phase synchronization. Rather, through an adjustment of lock detection thresholds, a predictive form of loss of lock may be permitted by measuring predetermined static phase error. Further embodiments of the present invention may thus utilize phase detectors and charge pumps to provide XOR functionality for lock detection. In wide loop applications, variation of loop gain may be significant and a means of monitoring loop performance may be required. Thus, embodiments of the present invention may modify loop parameters to counter the low noise performance required which may be generally difficult to meet in wide loops.

It is another aspect of embodiments of the present invention to employ exemplary circuits in RF components of communications systems such as point-to-point communications systems and/or point-to-multipoint communications systems. Further, exemplary RF components may be, but are not limited to a transceiver, receiver, transmitter, RF/IF module and/or synthesizer.

In sum, various configurations and embodiments are illustrated in FIGS. 1-7 and described herein. According thereto, PLL lock and loss of lock conditions detection can be advantageously provided including the aforementioned quality of phase lock and loss of lock as described. Although the present invention has been described in considerable detail with reference to certain preferred versions and embodiments thereof, other versions and embodiments are possible. Therefore, the spirit and scope of the appended claims should not be limited to the description of the preferred versions and embodiments contained herein.

What I claim is:

1. A phase locked loop circuit, comprising:
   an oscillator operative for providing an output frequency;
   a detector operative for detecting the output frequency of the oscillator, comparing the output frequency with a first reference signal and outputting a first signal and a second signal as a function of the output frequency and first reference signal comparison;
   a charge pump operatively connected to the detector, the charge pump comprising:
      a differential amplifier operative for receiving the first and second signals, receiving a predetermined threshold from a second reference signal at an input of the differential amplifier, monitoring a deviation of the first and second signals from the predetermined threshold, and generating a third signal as a function of the deviation, and a comparator operative for receiving the third signal, comparing the third signal to a window threshold, and generating a fourth signal as a function of the third signal and window threshold comparison, wherein the window threshold is set based on a predetermined loop variable; and an alarm circuit which receives the fourth signal and is adaptable to provide an alarm.

2. The phase locked loop circuit of claim 1 wherein the charge pump is a current charge pump.

3. The phase locked loop circuit of claim 1 wherein the charge pump is a voltage charge pump.

4. The phase locked loop circuit of claim 1 wherein the first signal is a function of static phase detector gain.

5. The phase locked loop circuit of claim 1 wherein the third signal and window threshold comparison further comprises measured static error from the window threshold.

6. The phase locked loop circuit of claim 1 wherein the predetermined loop variable includes oscillator gain, loop compensation, charge pump gain variation, or any combination thereof.

7. The phase locked loop circuit of claim 1 wherein the detector is a phase frequency detector.

8. The phase locked loop circuit of claim 1 wherein the alarm is a loss of frequency lock alarm.

9. The phase locked loop circuit of claim 1 wherein the oscillator is selected from the group consisting of voltage controlled oscillator, voltage controlled crystal oscillator, temperature compensated voltage controlled crystal oscillator, numerically controlled oscillator, and digitally controlled oscillator.

10. The phase locked loop of claim 1, wherein the fourth signal represents at least a predetermined amount of static error.

11. A method for controlling an oscillator in a phase locked loop, comprising the steps of:

detecting an output frequency of an oscillator in a phase locked loop;

comparing the output frequency with a first reference signal;

outputting a first signal and a second signal as a function of the output frequency and first reference signal comparison;

receiving, at an input of a differential amplifier, a predetermined threshold from a second reference signal;

monitoring, at the differential amplifier, a deviation of the first and second signals from the predetermined threshold;

generating, at the differential amplifier, a third signal as a function of the deviation;

comparing the third signal to a window threshold, wherein the window threshold is set based on a predetermined loop variable of the phase locked loop;

generating a fourth signal as a function of the third signal and window threshold comparison; and providing an alarm if the fourth signal exceeds a predetermined value, wherein the alarm is utilized to maintain the output frequency within a predetermined range.

12. The method of claim 11 wherein the first signal is a function of static phase detector gain.

13. The method of claim 11 wherein the third signal and window threshold comparison further comprises measured static error from the window threshold.

14. The method of claim 11 wherein the oscillator is selected from the group consisting of voltage controlled oscillator, voltage controlled crystal oscillator, temperature compensated voltage controlled crystal oscillator, numerically controlled oscillator, and digitally controlled oscillator.

15. The method of claim 11, wherein the fourth signal represents at least a predetermined amount of static error.

16. A circuit for providing a control window for an oscillator in a phase locked loop, comprising:

a detector circuit operative for detecting the output frequency of an oscillator, comparing the output frequency with a first reference signal and outputting a first signal and a second signal as a function of the output frequency and first reference signal comparison;

an amplifying circuit operatively connected to the detector circuit, the amplifying circuit capable of receiving the first and second signals, receiving a predetermined threshold from a second reference signal at an input of the amplifying circuit, monitoring a deviation of the first and second signals from the predetermined threshold, and generating a third signal as a function of the deviation;

a comparison circuit operatively connected to the amplifying circuit, the comparison circuit capable of receiving the third signal, comparing the third signal to a window threshold, and generating a fourth signal as a function of the third signal and window threshold comparison; and an alarm circuit which receives the fourth signal and is adaptable to provide an alarm, wherein the window threshold is set based on a predetermined loop variable of the phase locked loop and provides upper and lower levels for an oscillator parameter.

17. The circuit of claim 16 wherein the comparison circuit and amplifying circuit comprise a charge pump.

18. The circuit of claim 17 wherein the charge pump is selected from the group consisting of current charge pump and voltage charge pump.

19. The circuit of claim 16 wherein the first signal is a function of static phase detector gain.

20. The circuit of claim 16 wherein the third signal and window threshold comparison further comprises measured static error from the window threshold.

21. The circuit of claim 16 wherein the predetermined loop variable includes oscillator gain, loop compensation, charge pump gain variation, or any combination thereof.

22. The circuit of claim 16 wherein the detector is a phase frequency detector.

23. The circuit of claim 16 wherein the alarm is a loss of frequency lock alarm.

24. The circuit of claim 16 wherein the oscillator is selected from the group consisting of voltage controlled oscillator, voltage controlled crystal oscillator, temperature compensated voltage controlled crystal oscillator, numerically controlled oscillator, and digitally controlled oscillator.

25. The circuit of claim 16 wherein the oscillator parameter includes phase, frequency, or both.

26. The circuit of claim 16, wherein the fourth signal represents at least a predetermined amount of static error.

27. A communication system comprising:

at least one radio frequency component adaptable to receive or transmit an input signal in a predetermined frequency range, the component including circuitry comprising:

a phase locked loop ("PLL") adaptable to receive at least a portion of the input signal, the PLL including:

an oscillator operative for providing an output frequency;

a detector operative for detecting the output frequency of the oscillator, comparing the output frequency with a first reference signal and outputting a first signal and a second signal as a function of the output frequency and first reference signal comparison;

an amplifying circuit operatively connected to the detector circuit, the amplifying circuit and capable of receiving the first and second signals, receiving a predetermined threshold from a second reference signal at an input of the amplifying circuit, monitoring a deviation of the first and second signals from the predetermined threshold, and generating a third signal as a function of the deviation;

a comparison circuit operatively connected to the amplifying circuit, the comparison circuit and capable of receiving the third signal, comparing the third signal to a window threshold, and generating a fourth signal as a function of the third signal and window threshold comparison; and an alarm circuit operative for receiving the fourth signal and providing an alarm, wherein the window threshold is set based on a predetermined loop variable of the PLL.

28. The system of claim 27 wherein the system is a point-to-point communication system.

29. The system of claim 27 wherein the system is a point-to-multipoint communication system.

30. The system of claim 27 wherein the RF component is any one or a combination of transceiver, receiver, transmitter, RF/IF module and synthesizer.

31. The communication system of claim 27, wherein the fourth signal represents at least a predetermined amount of static error.

* * * * *